(12) United States Patent
Chen et al.

(10) Patent No.: US 9,154,099 B2
(45) Date of Patent: Oct. 6, 2015

(54) ELECTRONIC DEVICE AND METHOD FOR OPTIMIZING MUSIC

(71) Applicant: Chi Mei Communication Systems, Inc., New Taipei (TW)

(72) Inventors: Yu-Chen Chen, New Taipei (TW); Ming-Chih Lin, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 215 days.

(21) Appl. No.: 13/756,417

(22) Filed: Jan. 31, 2013

(65) Prior Publication Data

US 2013/0230190 A1 Sep. 5, 2013

(30) Foreign Application Priority Data

Mar. 1, 2012 (TW) .............................. 101106836 A

(51) Int. Cl.
*H03G 5/16* (2006.01)
(52) U.S. Cl.
CPC ..................................... *H03G 5/165* (2013.01)
(58) Field of Classification Search
CPC ..................................................... H03G 5/165
USPC ..................................... 381/103, 98, 101, 102
See application file for complete search history.

(56) References Cited

U.S. PATENT DOCUMENTS

| | | | | |
|---|---|---|---|---|
| 5,745,583 A * | 4/1998 | Koizumi et al. | ................. | 381/86 |
| 6,195,438 B1 * | 2/2001 | Yumoto et al. | ................. | 381/103 |
| 2007/0033147 A1 * | 2/2007 | Kaburagi | ......................... | 705/59 |
| 2007/0100481 A1 * | 5/2007 | Toms et al. | ..................... | 700/94 |
| 2007/0144335 A1 * | 6/2007 | Derboven et al. | ............... | 84/613 |
| 2008/0013752 A1 * | 1/2008 | Stephens | ........................ | 381/103 |
| 2008/0075303 A1 * | 3/2008 | Kim et al. | ..................... | 381/103 |
| 2009/0047993 A1 * | 2/2009 | Vasa | .......................... | 455/556.1 |
| 2009/0138505 A1 * | 5/2009 | Purdy | ........................ | 707/104.1 |
| 2009/0290725 A1 * | 11/2009 | Huang | .......................... | 381/103 |
| 2010/0004926 A1 * | 1/2010 | Neoran et al. | ................ | 704/201 |
| 2010/0325137 A1 * | 12/2010 | Paez | ............................. | 707/759 |

* cited by examiner

*Primary Examiner* — Harry S Hong
(74) *Attorney, Agent, or Firm* — Novak Druce Connolly Bove + Quigg LLP

(57) ABSTRACT

In a method for optimizing music using an electronic device, music genres and optimization parameters of each of the music genres are preset. The method classifies songs stored in a storage device of the electronic device according to the music genres. When a song is playing using a music player of the electronic device, a music genre of the song is determined. The method further optimizes the song using an equalizer of the music player according to the optimization parameters corresponding to the determined music genre.

15 Claims, 3 Drawing Sheets

ELECTRONIC DEVICE AND METHOD FOR OPTIMIZING MUSIC

BACKGROUND

1. Technical Field

Embodiments of the present disclosure relate to data optimization technology, and particularly to an electronic device and method for optimizing music using the electronic device.

2. Description of Related Art

When a user is playing music using a music player in an electronic device, an equalizer of the music player may be utilized to alter the frequency response of the music player, and make certain instruments or voices more prominent, or enhance particular aspects of an instrument's tone. For example, the user may select one kind of music genres (e.g., jazz, blue, or rock) provided by the equalizer to play a specified song, however, this selection has to be manually done. That is, the equalizer cannot determine the music genres for songs to be played. Therefore, an efficient method for optimizing music using the electronic device is desired.

DETAILED DESCRIPTION

All of the processes described below may be embodied in, and fully automated via, functional code modules executed by one or more general purpose electronic devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Figure 1:
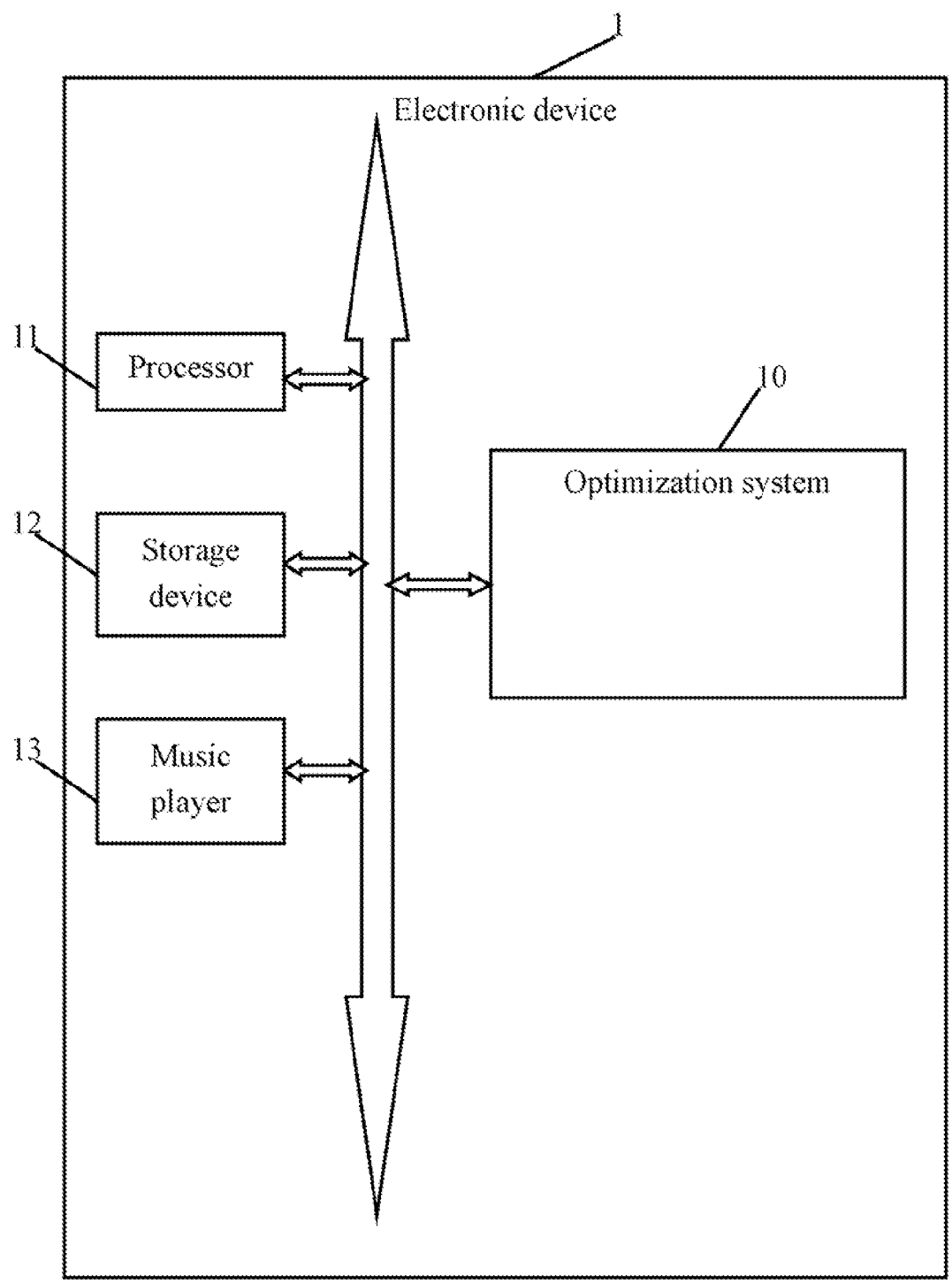
FIG. 1 is a block diagram of one embodiment of an electronic device including an optimization system.

FIG. 1 is a block diagram of one embodiment of an electronic device 1 including an optimization system 10. The electronic device 1 further includes at least one processor 11, a storage device 12, and a music player 13. FIG. 1 illustrates only one example of the electronic device 1 that may include more or fewer components than illustrated, or have a different configuration of the various components in other embodiments.

The optimization system 10 is used to recognize a music genre of a song to be played, and optimize the song according to optimization parameters corresponding to the music genre of the song. A detailed description of the optimization system 10 will be given in the following paragraphs.

In one embodiment, the electronic device 1 may be a mobile phone, a tablet computer, a personal digital assistant, a notebook computer, or any other device. In one embodiment, the optimization system 10 may include computerized instructions in the form of one or more programs that are executed by the at least one processor 11 and stored in the storage device 12. The storage device 12 stores one or more programs, such as operating systems, applications of the electronic device 1, and various kinds of data, such as songs. In some embodiments, the storage device 12 may be an external storage card, such as a memory stick, a smart media card, a compact flash card, a secure digital card, or any other type of memory storage device.

The music player 13 is an application installed in the electronic device 1, and is used to play songs or videos. In some embodiments, the music player 13 includes an equalizer (not shown in FIG. 1), which is used to optimize timbre of the songs.

Figure 2:
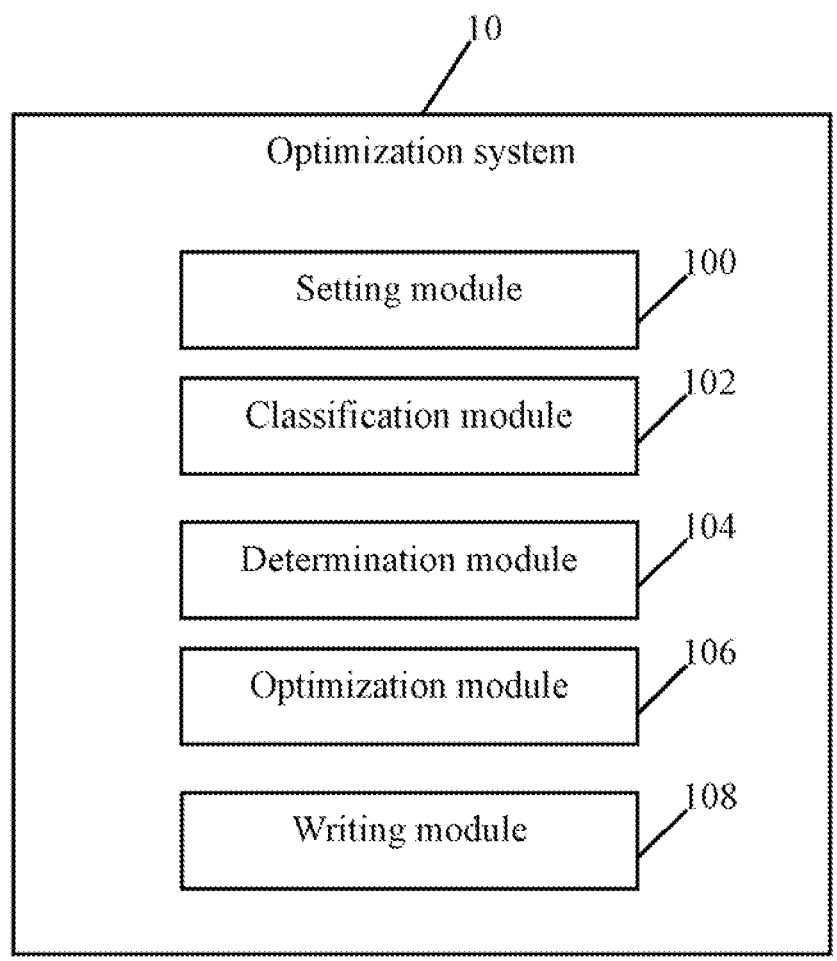
FIG. 2 is a block diagram of function modules of the optimization system in the electronic device.

FIG. 2 is a block diagram of function modules of the optimization system 10 included in the electronic device 1. In one embodiment, the optimization system 10 may include one or more modules, for example, a setting module 100, a classification module 102, a determination module 104, an optimization module 106, and a writing module 108. In general, the word "module," as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

Figure 3:
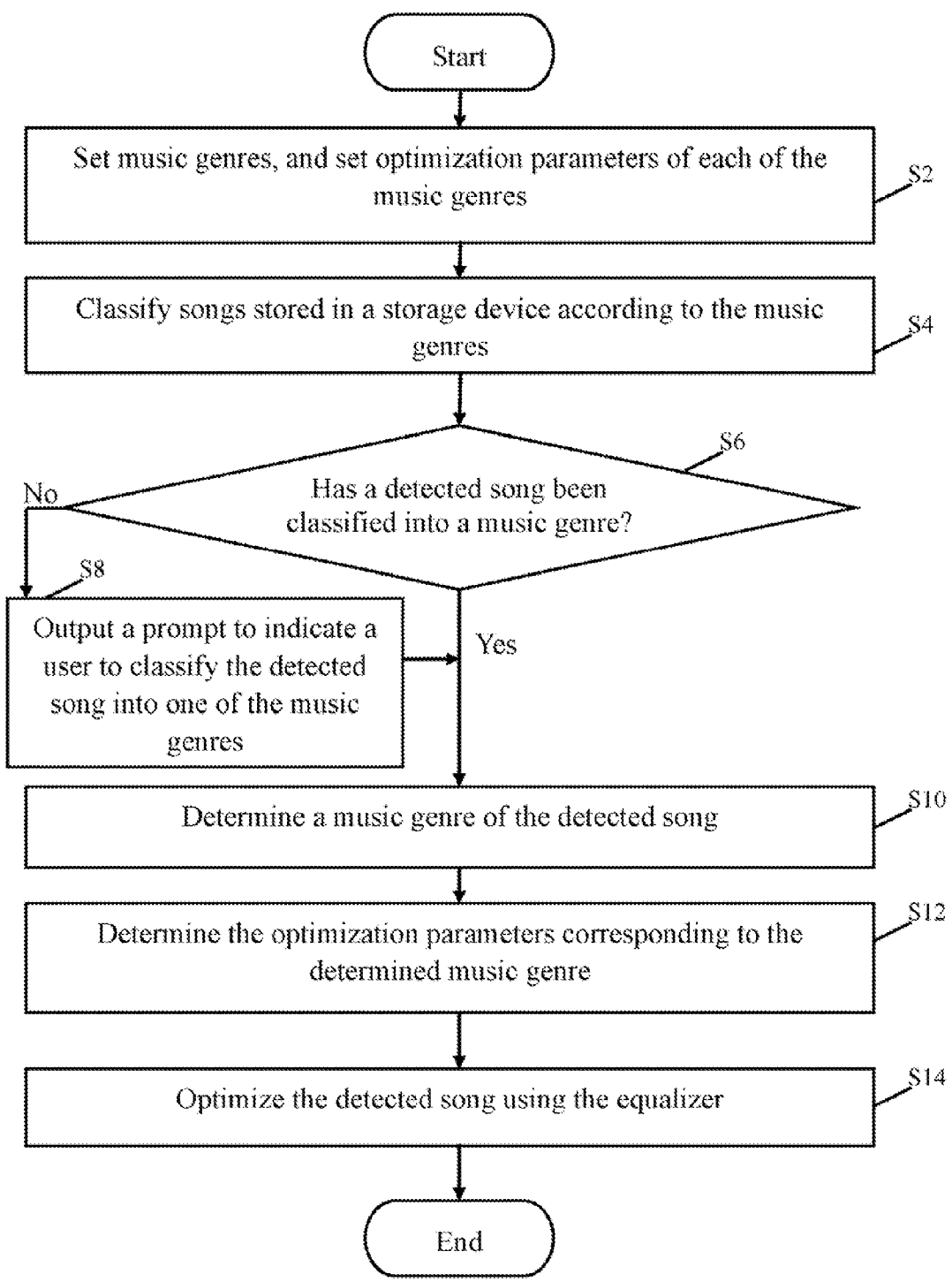
FIG. 3 is a flowchart of one embodiment of a method for optimizing music using the optimization system.

FIG. 3 is a flowchart of one embodiment of a method for optimizing music using the optimization system 10. Depending on the embodiment, additional steps may be added, others removed, and the ordering of the steps may be changed.

In step S2, the setting module 100 sets music genres, and sets optimization parameters of each of the music genres. In some embodiments, the music genres may include, but are not limited to normal, blue, jazz, rock, and classical. The optimization parameters may include frequency adjustment parameters, for example.

In step S4, the classification module 102 classifies the songs stored in the storage device 12 according to the music genres.

In some embodiments, the classification module 102 receives classification information of each of the songs in the storage device 12, and writes the classification information into attributes of each of the songs. The classification information represents the music genre of each of the songs.

In step S6, when the music player 13 is running, the determination module 106 detects which song is being played by the music player 13 (hereinafter referred to as "the detected song") and acquires attributes of the detected song. The determination module 106 further determines whether the acquired attributes of the detected song has classification information, so as to determine whether the detected song has been classified into one of the music genre. According to the above mentioned steps, the songs stored in the storage device 12 may have been classified. When the electronic device 1 receives new songs from the Internet or other devices, the new songs may not be classified. For example, when the detected song is a new song downloaded from the Internet, the detected song would not have corresponding classification information, it is represented that the detected song has not been classified. Accordingly, the new songs may be classified through steps S6 and S8.

If the detected song has not been classified into any music genre, in step S8, the setting modules 100 outputs a prompt to indicate to a user of the electronic device 1 to classify the detected song into one of the music genres, and the classification module 102 classifies the detected song into a corresponding music genre according to user input data. For example, the prompt may be a message prompt or an audio prompt, and may be a popped-up window, which has a menu for the user to select relevant music genres such as the music genre.

As mentioned above, when the classification module 102 receives classification information of the detected song, the classification module 102 writes the received classification information of the detected song into the attributes of the detected song.

If the detected song has been classified into one of the music genres, in step S10, the determination module 104 determines the music genre of the detected song. In some embodiments, the determination module 104 determines the music genre of the detected song by reading the classification information in attributes of the detected song.

In step S12, the determination module 104 determines the optimization parameters corresponding to the determined music genre.

In step S14, the optimization module 106 optimizes the detected song using the equalizer according to the determined optimization parameters.

In another embodiment that is not shown in FIG. 3, the user may optimized one or more songs though the equalizer manually, when the one or more songs are played using the music player 13. The writing module 108 receives customized optimization parameters of the one or more songs, and writes the customized optimization parameters into attributes each of the one or more songs.

Furthermore, when the determination module 104 determines the optimization parameters of the detected song in step S12, the determination module 104 may further determine whether the detected song has the customized optimization parameters. When the detected song has the customized optimization parameters, the optimization module 106 optimizes the detected song using the equalizer according to the customized optimization parameters rather than the optimization parameters corresponding to the determined music genre.

In other embodiments, the determination module 104 may determine whether the detected song has the customized optimization parameters before determining whether the detected song has been classified into one of the music genres. Thus, when the detected song has the customized optimization parameters, the optimization module 106 optimizes the detected song using the customized optimization parameters without determining the music genre of the detected song.

It should be emphasized that the above-described embodiments of the present disclosure, particularly, any embodiments, are merely possible examples of implementations, set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer-implemented method for optimizing music using an electronic device, the electronic device comprising a music player, a processor and a storage device, the music player comprising an equalizer, the method comprising:
   setting music genres, and setting optimization parameters of each of the music genres;
   classifying songs stored in the storage device, using the processor, according to the music genres;
   detecting a song being played by the music player when the music player is running, and determining a music genre of the detected song when the detected song has been classified;
   determining whether the detected song has customized optimization parameters;
   optimizing the detected song using the equalizer according to the optimization parameters corresponding to the determined music genre, if the detected song has no customized optimization parameters; and
   optimizing the detected song using the equalizer according to the customized optimization parameters, if the detected song has the customized optimization parameters.

2. The method according to claim 1, further comprising:
   receiving classification information of each of the songs in the storage device, the classification information representing the music genre of each of the songs; and
   writing the classification information into attributes of each of the songs.

3. The method according to claim 2, wherein the music genre of the detected song is determined by:
   reading the classification information in attributes of the detected song when the detected song is being played by the music player.

4. The method according to claim 1, further comprising:
   outputting a prompt to indicate to a user to classify the detected song into one of the music genres when the detected song has not been classified.

5. The method according to claim 1, further comprising:
   receiving the customized optimization parameters of one or more songs when the one or more songs are being played; and
   writing the customized optimization parameters into attributes of each of the one or more songs.

6. An electronic device, comprising:
   a music player that comprises an equalizer;
   a storage device;
   at least one processor; and
   one or more modules that are stored in the storage device and are executed by the at least one processor, the one or more modules comprising:
   a setting module that sets music genres, and sets optimization parameters of each of the music genres;
   a classification module that classifies songs stored in the storage device according to the music genres;
   a determination module that detects a song being played by the music player when the music player is running, determines a music genre of the detected song when the detected song has been classified, and determines whether the detected song has customized optimization parameters; and
   an optimization module that optimizes the detected song using the equalizer according to the optimization parameters corresponding to the determined music genre if the detected song has no customized optimization parameters, and optimizes the detected song using the equalizer according to the customized optimization parameters if the detected song has the customized optimization parameters.

7. The electronic device according to claim 6, wherein the classification module:
   receives classification information of each of the songs in the storage device, the classification information representing the music genre of each of the songs; and
   writes the classification information into attributes of each of the songs.

8. The electronic device according to claim 7, wherein the determination module determines the music genre of the detected song by reading the classification information in attributes of the detected song when the detected song is being played by the music player.

9. The electronic device according to claim 6, wherein the setting modules outputs a prompt to indicate to a user to classify the detected song into one of the music genres when the detected song has not been classified.

10. The electronic device according to claim 6, wherein the one or more modules further comprise a writing module that receives the customized optimization parameters of one or more songs when the one or more songs are being played, and writes the customized optimization parameters into attributes of each of the one or more songs.

11. A non-transitory storage medium having stored thereon instructions that, when executed by a processor of an electronic device, causes the electronic device to perform a method for optimizing music using the electronic device, the electronic device comprising a music player and a storage device, the music player comprising an equalizer, the method comprising:
  setting music genres, and setting optimization parameters of each of the music genres;
  classifying songs stored in the storage device according to the music genres;
  detecting a song being played by the music player when the music player is running, and determining a music genre of the detected song when the detected song has been classified;
  determining whether the detected song has customized optimization parameters;
  optimizing the detected song using the equalizer according to the optimization parameters corresponding to the determined music genre if the detected song has no customized optimization parameters; and
  optimizing the detected song using the equalizer according to the customized optimization parameters if the detected song has the customized optimization parameters.

12. The non-transitory storage medium according to claim 11, wherein the method further comprises:
  receiving classification information of each of the songs in the storage device, the classification information representing the music genre of each of the songs; and
  writing the classification information into attributes of each of the songs.

13. The non-transitory storage medium according to claim 12, wherein the music genre of the detected song is determined by:
  reading the classification information in attributes of the detected song when the detected song is being played by the music player.

14. The non-transitory storage medium according to claim 11, wherein the method further comprises:
  outputting a prompt to indicate to a user to classify the detected song into one of the music genres when the detected song has not been classified.

15. The non-transitory storage medium according to claim 11, wherein the method further comprises:
  receiving the customized optimization parameters of one or more songs when the one or more songs are being played; and
  writing the customized optimization parameters into attributes of each of the one or more songs.

* * * * *